PETER J. ULLMAN
ODIE L. LITTRELL
INVENTORS
BY Roger S. Borovoy
Stuart Lubitz
ATTORNEYS PETER J. ULLMAN
ODIE L. LITTRELL
INVENTORS
BY Roger S. Borovoy
Stuart Lubitz
ATTORNEYS PETER J. ULLMAN
ODIE L. LITTRELL
INVENTORS
BY Roger S. Borovoy
Stuart Lubitz
ATTORNEYS

United States Patent Office 3,421,203
Patented Jan. 14, 1969

3,421,203
PHOTODEVICE ENCLOSURE

Peter J. Ullman, Palo Alto, and Odie L. Littrell, Sunnyvale, Calif., assignors to Fairchild Camera and Instrument Corporation, a corporation of Delaware Filed Apr. 6, 1965, Ser. No. 445,944
U.S. Cl. 29—572 8 Claims
Int. Cl. H01g 9/00; H01l 15/02; H01c 7/08

ABSTRACT OF THE DISCLOSURE

An enclosed photosensitive device and a process for its manufacture, having a conductive supporting and connecting pin, a photosensitive device mounted on the pin, and a metal tube and rim assembly, the rim being mounted on the tube and containing a sealing glass with opposed optically flat surfaces so that the device can be exposed to light through these surfaces but is protected by the tube and rim assembly.

This invention relates to a protective enclosure for a photosensitive semiconductor device and a process for forming such a device. In particular, this invention relates to a protective enclosure adapted for efficient space utilization and having an optically flat transparent window, and to the process for forming such an enclosure.

It is well known in the semiconductor art that photosensitive semiconductor devices, such as silicon and germanium photodiodes and phototransistors, require protection from hostile environments in order to provide stable and reliable operation. The design of such an enclosure where space and economics are important considerations poses a difficult problem. For example, where photodiodes are employed in a punched card reader it is necessary that the size of the enclosure be limited. In the case of photodiodes and similar devices this size limitation conflicts with the principle that the response of such devices is proportional to its light sensing area. Thus, it is desirable to make the device within the enclosure as large as practical and to make the enclosure as small as possible.

The problem of producing a low cost, economical device is accentuated by the optical requirements of its enclosure. It is necessary when enclosing such a device the enclosure should include a window located adjacent the device. The window should have a minimum of influence on the direction and intensity of the incident radiation. This provides an efficient device and affords the system designer a miximum of use flexibility.

In the prior art, two general classes of protective enclosures for semiconductor photosensitive devices have been developed. In one class of devices a glass window has been installed in the cap of a standard transistor enclosure. Such devices are shown in U.S. Patent 2,898,474, issued on Aug. 4, 1959 to R. F. Rutz and U. S. Patent 2,749,488, issued on June 5, 1956, to S. E. Mayer. This arrangement suffers from two disadvantages—inefficient use of space and unsatisfactory optical properties. In general, such enclosures are too bulky for many applications and the window is of poor quality and varies from unit to unit in manufacture. In order to provide flat uniform windows, the cost of the enclosures would be increased by at least an order of magnitude. In addition to these disadvantages, the seal around about the window in such arrangements may be imperfect and the mechanical soundness of the package may leave much to be desired.

The second class of prior art enclosures has employed small diameter glass tubings which are flame sealed on one end to provide a window. At the other end of the enclosure a head assembly with fine lead wires is inserted and provided with a pinch-off seal. This enclosure, which is generally referred to as the "matchstick" package, suffers from the disadvantages of extreme fragility of the leads and seal and relatively uncontrolled optical properties of the window. Such a package does have the advantage of permitting high density packing of the devices for data processing applications. A prior art patent disclosing an enclosure similar to the "match stick" package is U.S. Patent 3,134,058, issued to A.M. Walkow on May 19, 1964.

The invented structure solves the prior art problems by employing a metal tube with its ends sealed with sealing glass. The tube is substantially filled with glass and little if any of the glass project from the tube. The tube may have a relatively small diameter which enables the enclosed device to be employed in high density arrangements. The sealing glass is a solid bulky mass that surrounds a substantial length of the leads and is in turn surrounded by the tube. This arrangement has the advantages of providing a long reliable hermetic seal, an optically flat window, a mechanically sound structure and rigid support and added strength for any lead that passes therethrough.

More specifically, the electrical lead into the interior of the tube is a Kovar pin which is concentrically surrounded in sequence by sealing glass and the tube. Thus, one end of the tube is sealed by the sealing glass and the lead pin. The other end of the tube is sealed only by sealing glass. The photosensitive device contained within the tube is thereby hermetically sealed. The end of the tube sealed only with glass forms an optically flat transparent window located adjacent the photosensitive device. This window enables light to be effectively transmitted to the photosensitive device and enables light to be equally distributed over the surface of the photosensitive device. This makes the device insensitive to the location of the light source so long as part of the light is incident thereto.

The tube forming the enclosure may be divided into two parts, a rim and a tube portion. In such an embodiment the tube and rim are joined by a resistance weld which does not contaminate the enclosure and provides a continuous reliable joint. From this it can be seen that the enclosure has the best features of metal enclosures and glass enclosures in addition to other advantages.

Briefly, the structure of the device comprises an enclosed photosensitive device adapted for effective utilization of space and efficient transmission of light to the photosensitive device, comprising: a conductive supporing and connecting pin; a photosensitive device mounted on and connected to the pin; a metal tube around and separated from the pin; a sealing glass substantially filling the separation between the tube and the pin and sealingly attached thereto; and a rim having substantially the same outside diameter as the tube. The rim is joined to the tube adjacent the photosensitive device and substantially filled with sealing glass having opposed optically flat surfaces, whereby the photosensitive device is exposed to light by the flat optical surface and is protectively enclosed by the tube and rim sealed with glass.

The package may be reliably and economically manufactured by employing the process of this invention. The process involves first substantially filling and sealing a metal tube with sealing glass to effectively seal its inside diameter. The sealing glass at one end of the tube is exposed. The finished glass sealed tube may be cut to form a rim and then joined to another sealed tube by resistance welding. The use of two parts enables a photosensitive device mounted at one end of the tube to be easily reached prior to joining the two parts. This enables one of the leads of the photosensitive device to be readily attached to the inside diameter of the tube. The resistance welding of the two parts is accomplished without affecting the tube seals or creating contamination within the enclosures. This welding may be facilitated by gold plating the two tubes and forming an angular edge on one of the two parts being joined.

Briefly, the process of making the enclosure comprises the steps of: sealing a metal rim with glass; and resistance welding the rim to a metal tube sealed at one end and having a photosensitive device mounted at the other end. The rim is resistance welded to the end of the tube having the photosensitive device, whereby an enclosure for a photosensitive device is formed having an optically flat window adjacent the photosensitive device.

The above structure and process will be readily understood by reference to the detailed specification which follows and the drawings wherein.

Figure 1:
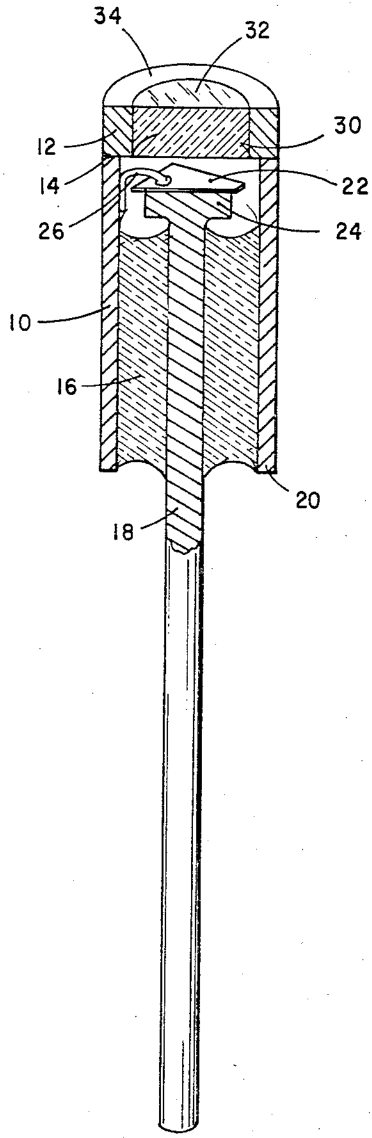
FIG. 1 is a sectional view of the enclosed photosensitive device.

Referring to FIG. 1, the enclosure comprises a tube 10 joined to a rim 12 by a resistance weld 14. The Kovar tube 10 is filled with a sealing glass compound 16, such as Corning 7052 Kovar sealing glass, which surrounds a pin 18 located along the axis of cylindrical tube 10. Glass 16 functions as a support for pin 18. Preferably tube 10, rim 12 and pin 18 are made from a conductive metal which has a coefficient expansion matching the sealing glass to be used, such as Kovar or Fernico which contain approximately 54% Fl, 28% Ni and 18% Co. Pin 18 has a photosensitive device 22, such as a phototransistor or photodiode, attached to its flat end 24 with one lead 26 from the photosensitive device connected to tube 10.

The sealing glass 16 forms an intimate seal around pin 18 and the inside diameter of tube 10 for a substantial portion of their length. The sealing glass around pin 18 seals one end 20 of the enclosure. In addition to forming a seal, the sealing glass 16 adds strength and rigidity to tube 10, thereby providing a mechanically sound package. The fragility of the lead connection to the package is minimized by the use of a pin surrounded and supported by glass.

The rim 12 at the top of the enclosure has an inside diameter smaller than that of tube 10, resulting in the wall of rim 12 being thicker than tube 10. Although this is not critical, a thicker outer rim reduces heat shock on the glass-to-metal seal during the final welding operation. The thickness of rim 12 enables a resistance weld to be employed to connect tube 10 and rim 12; this thickness prevents the inside diameter of rim 12 from reaching a temperature that might alter the inside seal. The resistance weld 14 forms a continuous, reliable, air tight joint that may be formed without contaminating the enclosure.

The rim 12 is entirely filled with a sealing glass 30 having an exposed surface 32 substantially flush with the top surface 34 of rim 12. Both surfaces are finished by mechanical polishing or fire polishing to form an optically flat transparent window. Thus, the rim 12 and sealing glass 30 located adjacent photosensitive device 22 form a window that is adapted to evenly distribute light incident thereto over the surface of device 22. In addition, when rim 12 is attached to tube 10, the device 22 is enclosed by a hermetic seal in a mechanically rigid enclosure. The use of a tube-like structure enables photosensitive devices to be employed in high density arrangements. Tubes and rims having an outside diameter of .080 inch have been employed. It should be noted that the inside diameter of tube 10 and rim 12 need not be much greater than the exterior dimension of device 22.

Figure 2:
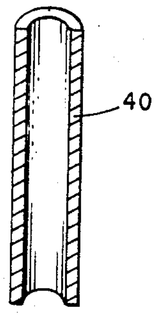
FIGS. 2–7 show the device at various stages of manufacture.

The process for forming the device shown in FIG. 1 is illustrated in FIGS. 2–7. A Kovar tube 40 is prepared for sealing by first outgassing and then oxidizing its inside diameter (FIG. 2). The outgassing removes any carbon that exists on the inside diameter, thereby preventing the formation of gas bubbles when the inside diameter of tube 10 is later sealed with glass. The oxidation of the inside diameter is necessary for the glass to form a seal with the tube. Both the outgassing and oxidizing are well known procedures in the glass-to-metal sealing art.

Figure 3:
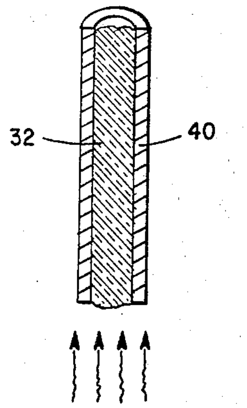

The tube 40 is next filled with sealing glass that may take the form of a cane of sealing glass 32 with a diameter slightly smaller (about 1 mil) than the inside diameter of tube 40. The sealing glass 32 and tube 40 are fired in an inert atmosphere at a temperature between about 950°–1150° C., preferably about 1100° C. whereupon a seal is effected around the inside diameter of tube 40 (FIG. 3).

Figure 4:
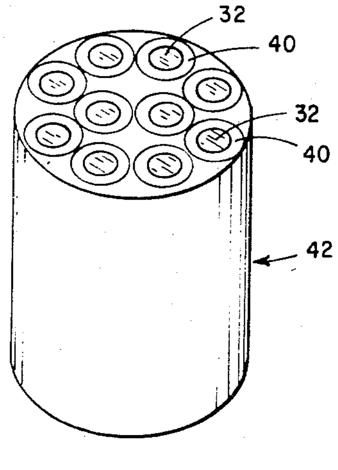

A plurality of glass filled and sealed tubes 40 are joined to form an integral composite bundle 42 typically having a diameter of one inch (FIG. 4). This joining may be readily accomplished by employing an epoxy fixture having a plurality of holes with a length about as long as tuges 40. The glass filled tubes 40 are dipped in epoxy which secures the tubes in the holes of the fixture. This produces composite member 42 which includes a plurality of glass filled tubes.

Figure 5:
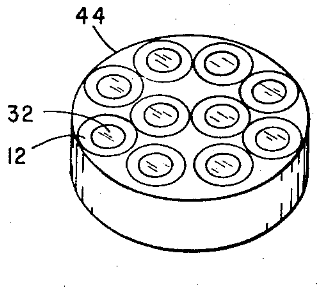

The composite member 42 is then sliced into a plurality of wafers 44 that typically have a thickness of 2–4 mils greater than the thickness of the finished rim 12 (FIG. 5). Slicing may be accomplished on a diamond saw such as the ones commonly used in the semiconductor art. After slicing, the wafers are lapped and polished to a final thickness and finished by well known techniques. The polishing may be accomplished either by mechanical polishing wafers 44 or by fire polishing individual rims 12 in an inert atmosphere and temperature adapted to prevent undesired flow of the sealing glass. The use of fire polishing has the advantage of resealing any leaks or cracks in the glass-to-metal seal which may be caused by mechanical shock during the sawing operation or other processing and handling operations. Fire polishing is also somewhat more economical than mechanical polishing. However, for extremely high quality windows, a mechanical polish produces a more nearly perfect finish than the fire polishing technique.

Figure 6:
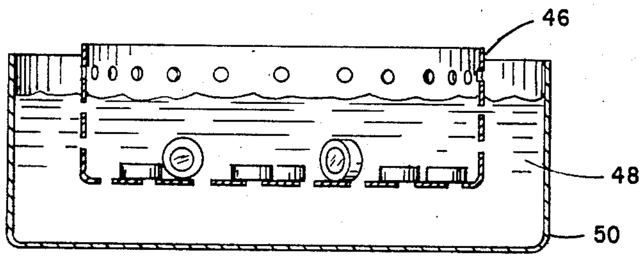

Regardless of the polishing technique employed, the individual rims 12 must eventually be separated from wafer 44. This may be readily accomplished by placing the wafers into a container 46 and submerging it in a solvent 48 contained in tank 50 (FIG. 6). The solvent is selected to be one which will dissolve the epoxy or other material which holds the individual rims together. Thus a plurality of individual rims will remain at the bottom of container 46 when it is removed from solvent 48. The individual glass filled rims 12 may then be prepared for welding.

The rims 12 are joined to tubes 10 sealed with glass 16 and having a photosensitive device mounted therein. The glass filled tubes 10 are formed by outgassing, oxidizing and firing in a manner substantially identical with that employed to form tubes 40 (FIGS. 2 and 3). The main differences between forming glass filled tube 40 and glass filled tube 10 is that a Kovar pin 18 is placed within tubular sealing glass 16 of tube 10, but not, of course, in tube 40. The sealing glass 16 and pin 18 are placed within tube 10 and fired simultaneously to seal one end of tube 10. The sealing glass 16 does not entirely fill the tube 10 as there is no glass above the surface 52 of pin 18. This removes the glass seal a sufficient distance from weld 14 (FIG. 1) so that it is not substantially affected by the heat generated during welding. In addition, a portion of the inside diameter of tube 10 remains available for use as an electrical connection to photosensitive device 22 via lead 26. The bottom of the photosensitive device 22 is also electrically connected to pin 18.

Figure 7:
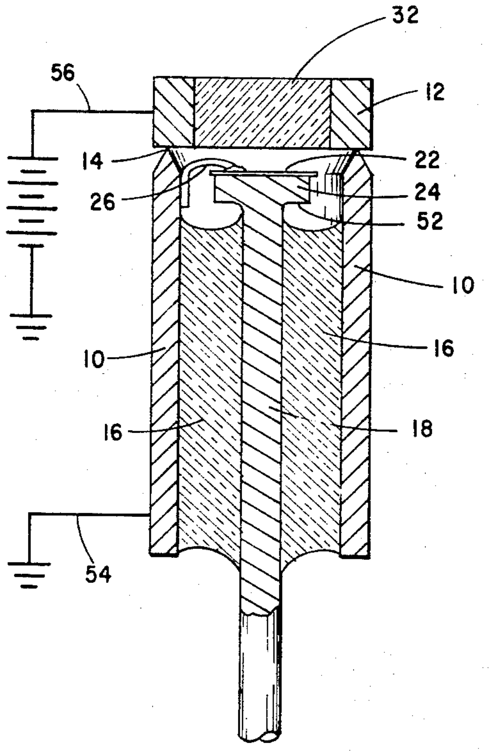

The completed rim 12 and tube 10 are joined by an appropriate welding procedure. Preferably, tube 10 is resistance welded to rim 12. This is facilitated by first forming an angled edge at the end of tube 10 adjacent the surface of rim 12 where the weld is formed. This edge is preferably an acute angle of 60° or less, making a V-configuration which provides high contact pressures between rim 12 and tube 10 with a low total applied force. The use of a low total force avoids column buckling of the thin tube while electrical contact around the entire periphery of the joint is achieved. The use of the thin tube enables the weld area to be positioned a sufficient distance from the glass-metal seal of rim 12 to avoid cracking of the seal during the welding cycle. It has been found that a particularly excellent weld results when tube 10 and rim 12 are gold plated with a sufficient thickness of gold to provide good electrical contact between the welding electrodes 54 and 56. A gold plated thickness of approximately 200 microinches has proven satisfactory for this purpose. With tube 10 and rim 12 positioned as shown in FIG. 7, electrodes 54 and 56 contact tube 10 and rim 12, respectively, and form the resistance weld 14. Thus, the enclosure of the photosensitive device shown in FIG. 1 is completed.

The invented process enables enclosures for photosensitive devices to be economically and reliably manufactured. The resulting devices are uniform and provide a window of excellent optical properties. The enclosure is hermetically sealed by a sealing glass which has a substantial seal length and which also provides a mechanically secure arrangement. The joining of tube 10 and rim 12 is accomplished without contamination of the enclosed region which houses the photosensitive device and without substantially affecting the metal-glass seal.

While the above detailed description has shown the fundamental novel features of the invention as applied to a preferred embodiment, it will be understood that various omissions and substitutions and changes in the form and details of the device and method illustrated may be made by those skilled in the art, without departing from the spirit of the invention. It is the intention, therefore, to be limited only as indicated by the scope of the following claims.

We claim:

1. The process of forming an enclosed photosensitive device, comprising:

outgassing and oxidizing a rim of a metal;

filling said rim with a sealing glass having a coefficient of expansion matching said metal so that said sealing glass is exposed at one surface of the rim;

firing said rim and said sealing glass to form an intimate bond and seal between said metal rim and said sealing glass;

resistance welding said rim to a tube of the same metal sealed at one end and having a photosensitive device mounted at the other end, said rim being located adjacent the photosensitive device, whereby an enclosed photosensitive device is formed having an optically flat window.

2. The process of forming an enclosed photosensitive device comprising:

outgassing and oxidizing a metal rim;

filling said rim with a sealing glass having a coefficient of expansion matching said metal so that said sealing glass is exposed at one surface of the rim;

firing said rim and said sealing glass to form an intimate bond and seal between said rim and said sealing glass;

resistance welding said rim to a tube of the same said metal sealed at one end and having a photosensitive device mounted at the other end, said rim being located adjacent the photosensitive device and said welding taking place at a distance from the sealing glass such that the heat generated by the welding does not alter the sealing of the rim and the tube, whereby an enclosed photosensitive device is formed having an optically flat window.

3. The process of forming an optically flat window for a photosensitive device, comprising:

outgassing and oxidizing a plurality of metal tubes;

filling said plurality of metal tubes with a sealing glass having a coefficient of expansion matching said metal so that said sealing glass is exposed at one surface of the rim;

firing said plurality of filled tubes to form an intimate bond and seal between said glass and said tube;

joining said plurality of fired tubes into a composite bundle with the axis of said tubes substantially parallel;

transversely slicing said composite bundle into a plurality of wafers each containing a plurality of sliced tube sections filled with said sealing glass;

polishing the surfaces of the wafers to simultaneously form a plurality of polished sealing glass surfaces; and separating said plurality of sections within said wafer to form a plurality of individual rims each having an optically flat window.

4. The process of forming an optically flat window for a photosensitive device, comprising:

sealing a plurality of metal tubes with a sealing glass having a coefficient of expansion matching said metal so that said sealing glass is exposed at one surface of the rim;

joining a plurality of sealed tubes into a composite member with the axis of said tubes substantially parallel;

transversely slicing said composite member into a plurality of wafers each containing a plurality of sliced sections;

polishing the surfaces of the wafer whereby a plurality of sealing glass surfaces associated with the sections are simultaneously polished; and separating said plurality of sections within said wafer to form a plurality of individual rims to obtain a plurality of optically flat windows.

5. The process of forming an enclosed photosensitive device comprising:

sealing a plurality of metal tubes with a sealing glass having a coefficient of expansion matching said metal so that said sealing glass is exposed at one surface of the rim;

joining a plurality of sealed tubes into a composite member with the axis of said tubes substantially parallel;

transversely slicing said composite member into a plurality of wafers each containing a plurality of sliced sections;

polishing the surfaces of the wafer whereby a plurality of sealing glass surfaces associated with the sections are simultaneously polished;

separating said plurality of sections within said wafer to form a plurality of individual rims to obtain a plurality of optically flat windows; and welding said rims to tubes sealed at one end and having a photosensitive device mounted at the other end, said rim welded to the end of the tube adjacent the photosensitive device, whereby an enclosed photosensitive device is formed.

6. The process defined in claim 5 wherein the plurality of tubes are joined by epoxy, and are separated by dissolving the epoxy.

7. The process defined in claim 6 wherein said composite member is mechanically polished.

8. The process defined in claim 7 wherein the rim and tube are joined by resistance welding.

References Cited

UNITED STATES PATENTS

| | | | |
|---|---|---|---|
| 2,749,488 | 6/1956 | Mayer | 317—234 |
| 3,119,052 | 1/1964 | Tsuji | 317—234 |
| 3,281,606 | 10/1966 | Luek | 250—239 |

ROBERT SEGAL, *Primary Examiner.*

R. F. HOSSFELD, *Assistant Examiner.*

U.S. Cl. X.R.

29—423; 136—89; 250—211; 317—234